United States Patent
Huh et al.

(10) Patent No.: US 12,055,592 B2
(45) Date of Patent: Aug. 6, 2024

(54) INSPECTION EQUIPMENT FOR INSPECTING SECONDARY BATTERY CELL

(71) Applicant: YHT Co., Ltd., Hwaseong-si (KR)

(72) Inventors: Yeong Baek Huh, Hwaseong-si (KR); Jong Hun Lee, Hwaseong-si (KR)

(73) Assignee: YHT Co., Ltd., Hwaseong-si (KR)

(*) Notice: Subject to any disclaimer, the term of this patent is extended or adjusted under 35 U.S.C. 154(b) by 98 days.

(21) Appl. No.: 17/913,637

(22) PCT Filed: Mar. 18, 2021

(86) PCT No.: PCT/KR2021/003355
§ 371 (c)(1),
(2) Date: Sep. 22, 2022

(87) PCT Pub. No.: WO2021/194162
PCT Pub. Date: Sep. 30, 2021

(65) Prior Publication Data
US 2023/0160967 A1   May 25, 2023

(30) Foreign Application Priority Data
Mar. 27, 2020   (KR) .................. 10-2020-0037490

(51) Int. Cl.
*G01R 31/385*   (2019.01)
*G01B 5/06*   (2006.01)
(Continued)

(52) U.S. Cl.
CPC ........... *G01R 31/3865* (2019.01); *G01B 7/06* (2013.01); *G01R 31/1227* (2013.01);
(Continued)

(58) Field of Classification Search
CPC ........ G01B 5/06; G01B 7/06; G01B 31/1227; G01B 31/378; G01B 31/385;
(Continued)

(56) References Cited

U.S. PATENT DOCUMENTS

2013/0305835 A1* 11/2013 Jansky .................. G01N 3/08
73/818

FOREIGN PATENT DOCUMENTS

| CN | 104466224 A | * 3/2015 | ............. B30B 15/30 |
| CN | 108682892 A | * 10/2018 | |

(Continued)

OTHER PUBLICATIONS

Translation of KR-102081671-B1 (Year: 2020).*
(Continued)

*Primary Examiner* — Matthew P Travers
(74) *Attorney, Agent, or Firm* — IP Spring

(57) ABSTRACT

An inspection system for inspecting a secondary battery cell is generally described. An example inspection system includes a thickness measurement unit, an electrical characteristics measurement unit, a print processing unit, a tab cutting unit, a mass measurement unit, a tab inspection unit and a defect selection unit. The thickness measurement unit, the electrical characteristics measurement unit, the print processing unit, the tab cutting unit, the mass measurement unit, the tab inspection unit and the defect selection unit are arranged in series, and a plurality of secondary battery cells are transferred in line throughout the inspection system.

11 Claims, 12 Drawing Sheets

(51) Int. Cl.
| | |
|---|---|
| *G01B 7/06* | (2006.01) |
| *G01R 31/12* | (2020.01) |
| *G01R 31/378* | (2019.01) |
| *G01R 31/389* | (2019.01) |
| *G01R 31/396* | (2019.01) |
| *H01M 10/04* | (2006.01) |
| *H01M 10/42* | (2006.01) |

(52) U.S. Cl.
CPC ......... *G01R 31/378* (2019.01); *G01R 31/389* (2019.01); *G01R 31/396* (2019.01); *H01M 10/0404* (2013.01); *H01M 10/4285* (2013.01); *G01B 5/06* (2013.01)

(58) Field of Classification Search
CPC .................. G01B 31/3865; G01B 31/389; G01B 31/396; H01M 10/04; H01M 10/0404; H01M 10/4285
See application file for complete search history.

(56) References Cited

FOREIGN PATENT DOCUMENTS

| CN | 109378526 | A | * | 2/2019 | ............. G01B 21/02 |
|---|---|---|---|---|---|
| KR | 20060011427 | A | * | 2/2006 | |
| KR | 20100018178 | A | * | 2/2010 | |
| KR | 10-2015-0061825 | A | | 6/2015 | |
| KR | 20160008879 | A | * | 1/2016 | |
| KR | 10-2017-0013705 | A | | 2/2017 | |
| KR | 20170019880 | A | * | 2/2017 | |
| KR | 20170041538 | A | * | 4/2017 | |
| KR | 10-2018-0012000 | A | | 2/2018 | |
| KR | 10-2019-0089369 | A | | 7/2019 | |
| KR | 20190089369 | A | * | 7/2019 | |
| KR | 102081671 | B1 | * | 2/2020 | |
| KR | 10-2146945 | B1 | | 8/2020 | |

OTHER PUBLICATIONS

Translation of KR-20190089369-A (Year: 2019).*
Translation of CN-109378526-A (Year: 2019).*
Translation of CN-108682892-A (Year: 2018).*
Translation of KR-20170041538-A (Year: 2017).*
Translation of KR-20170019880-A (Year: 2017).*
Translation of KR-20160008879-A (Year: 2016).*
Translation of CN-104466224-A (Year: 2015).*
Translation of KR-20100018178-A (Year: 2010).*
Translation of KR-20060011427-A (Year: 2006).*
KIPO, International Search Report for International Patent Application No. PCT/KR2021/003355, Jun. 30, 2021, 6 pages.
KIPO, Written Opinion for International Patent Application No. PCT/KR2021/003355, Jun. 30, 2021, 7 pages.
KIPO, Notice of Allowance for Korean Patent Application No. 10-2020-0037490, Aug. 12, 2020, 6 pages.
KIPO, Office Action for Korean Patent Application No. 10-2020-0037490, Apr. 20, 2020, 15 pages.

* cited by examiner

200

INSPECTION EQUIPMENT FOR INSPECTING SECONDARY BATTERY CELL

CROSS-REFERENCE TO RELATED APPLICATIONS

This application is the U.S. National Stage filing under 35 U.S.C. § 371 of International Patent Application No. PCT/KR2021/003355, filed on Mar. 18, 2021, which in turn claims priority under PCT Article 8 and/or 35 U.S.C. § 119(a) to Korean Patent Application No. 10-2020-0037490, filed on Mar. 27, 2020. Korean Patent Application No. 10-2020-0037490 is incorporated herein by reference in its entirety.

TECHNICAL FIELD

The present disclosure relates to an inspection system for inspecting a secondary battery cell, particularly a pouch-type secondary battery cell.

BACKGROUND

Unless otherwise indicated herein, the materials described in this section are not prior art to the claims in this application and are not admitted as prior art by inclusion in this section. As the use of fossil fuels has caused economic and environmental problems, the interest in and demand for new renewable energy has surged. At the same time, the needs for secondary batteries capable of storing new renewable energy are also increasing. In particular, lithium secondary batteries are widely used as core parts of portable electronic devices, energy storage systems (ESSs) and electric vehicles, since they have high energy density, long life and low self-discharge rate. There are three types of the lithium secondary batteries mainly used, including: a prismatic battery, a polymer battery and a cylindrical battery. The polymer battery is also called as a pouch-type secondary battery because a stack of electrodes is wrapped with an aluminum thin film (which is usually referred to as a pouch). Since the polymer battery can be made thin and light, the use thereof continues to increase. After manufactured, the pouch-type secondary battery needs to be inspected on whether there is a manufacturing defect. Defects to be inspected include not only external characteristics, such as the thickness and shape of the secondary battery, but also electrical characteristics of the secondary battery. In order to efficiently and accurately inspect manufactured secondary battery cells, conventionally, various inspection apparatuses, such as an insulation inspection apparatus of PriorArt Document 1, an OCV/IR inspection apparatus of Prior Art Document 2, and an electrode tab inspection apparatus of Prior Art Document 3, have been proposed. However, conducting inspections on the manufactured secondary battery cells for various items is followed by spending a lot of money and time.

- (Patent Document 1) (Prior Art Document 1) Korean Patent Publication No. 10-1487496; Method and apparatus for checking insulation of pouch-type secondary battery
- (Patent Document 2) (Prior Art Document 2) Korean Patent Publication No. 10-1084807; Method of detecting IR/OCV of secondary battery and equipment for the method
- (Patent Document 3) (Prior Art Document 3) Korean Patent Publication No. 10-1874281; System for producing electrodes of battery

SUMMARY

In view of the foregoing, the present disclosure provides a secondary battery inspection system that can quickly and accurately perform various inspections of secondary batteries and various processes related thereto and thus can improve the inspection throughput for the secondary batteries.

An inspection system for inspecting a secondary battery cell according to an embodiment of the present disclosure is disclosed. An example inspection system may include a thickness measurement unit, an electrical characteristics measurement unit, a print processing unit, a tab cutting unit, a mass measurement unit, a tab inspection unit and a defect selection unit. The thickness measurement unit may measure the thickness of each of a plurality of secondary battery cells. The electrical characteristic measurement unit may measure electrical characteristics of a corresponding secondary battery cell using electrode tabs of each of the plurality of secondary battery cells. The print processing unit may include a data printer and a data verification unit. The data printer may print information about each of the plurality of secondary battery cells on a surface of a corresponding secondary battery cell. The data verification unit may verify the printed information. The tab cutting unit may cut the electrode tabs of each of the plurality of secondary battery cells to a predetermined size. The mass measurement unit may measure the mass of each of the plurality of secondary battery cells. The tab inspection unit may obtain a cut shapes of the electrode tabs of each of the plurality of secondary battery cells. The defect selection unit may include a plurality of magazines and a cell transferer. Each of the plurality of magazines may store one or more secondary battery cells. The cell transferer may select some defective secondary battery cells and transfer the selected secondary battery cells to a corresponding magazine among the plurality of magazines. The thickness measurement unit, the electrical characteristics measurement unit, the print processing unit, the tab cutting unit, the mass measurement unit, the tab inspection unit and the defect selection unit may be arranged in series. In this regard, the plurality of secondary battery cells may be inspected while being transferred in line within the inspection system.

In some examples, the inspection system may further include a control unit. The control unit may be configured to control an in-line transfer of the plurality of secondary battery cells. Also, the control unit may be configured to control operations of the thickness measurement unit, the electrical characteristics measurement unit, the print processing unit, the tab cutting unit, the mass measurement unit, the tab inspection unit and the defect selection unit, and to process data from the thickness measurement unit, the electrical characteristics measurement unit, the mass measurement unit and the tab inspection unit. In some examples, the inspection system may further include a cell supply and retrieval unit. The cell supply and retrieval unit may unload the plurality of secondary battery cells from a cell tray on which the plurality of secondary battery cells are loaded, move the cell tray, and load, onto the cell tray, the secondary battery cells having not been selected by the defect selection unit.

In some examples, the thickness measurement unit includes a pressing plate for pressing a secondary battery cell, and may measure the thickness of the secondary battery cell by measuring a plurality of points on a surface of the pressing plate in contact with the secondary battery cell. The thickness measurement unit may include a linear variable differential transformer (LVDT).

In some examples, the electrical characteristic measurement unit may include: an open circuit voltage/impedance reactance (OCV/IR) measurement unit, an insulation voltage measurement unit that measures an insulation voltage of a secondary battery cell by contacting sensing grippers with an anode tab and a terrace of the secondary battery cell, and an insulation resistance measurement unit that measures an insulation resistance of the secondary battery cell by contacting the sensing grippers with a cathode tab and the terrace of the secondary battery cell.

In some examples, the data printer of the print processing unit may include a plurality of print headers. Each of the plurality of print headers may print information about a secondary battery cell on the corresponding secondary battery cell. In some examples, the data verification unit of the print processing unit may include an optical reader configured to read the printed information. The optical reader may be inclined at 60 degrees with respect to a transfer direction of the secondary battery cell.

In some examples, the tab cutting unit may include an upper cutter and a lower cutter that are replaceably fixed. The upper cutter and the lower cutter may have cutting blades at two facing edges, respectively. In some examples, the tab cutting unit may further include an air blower provided in at least one of a region where the upper cutter is fixed and a region where the lower cutter is fixed.

The foregoing summary is illustrative only and is not intended to be in any way limiting. In addition to the illustrative embodiments and features described above, further embodiments and features will become apparent by reference to the drawings and the following detailed description.

BRIEF DESCRIPTION OF THE DRAWINGS

The foregoing and other features of the present disclosure will be described in detail with reference to the accompanying drawings. Understanding that these drawings depict only several examples in accordance with the disclosure and are, therefore, not to be considered limiting of its scope, the disclosure will be described with additional specificity and detail through use of the accompanying drawings, in which.

DETAILED DESCRIPTION

The terms used herein are used only to describe specific examples, but do not intend to limit the present disclosure. A singular expression includes a plural expression unless it is clearly construed in a different way in the context. All terms including technical and scientific terms used herein have the same meaning as commonly understood by a person with ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. In some cases, even terms defined in the present disclosure should not be interpreted as excluding embodiments of the present disclosure.

The foregoing features and other features of the present disclosure will be sufficiently apparent from the following descriptions with reference to the accompanying drawings. These drawings merely illustrate several embodiments in accordance with the present disclosure. Therefore, they should not be understood as limiting the present disclosure. The present disclosure will be described in more detail with reference to the accompanying drawings.

Figure 12:
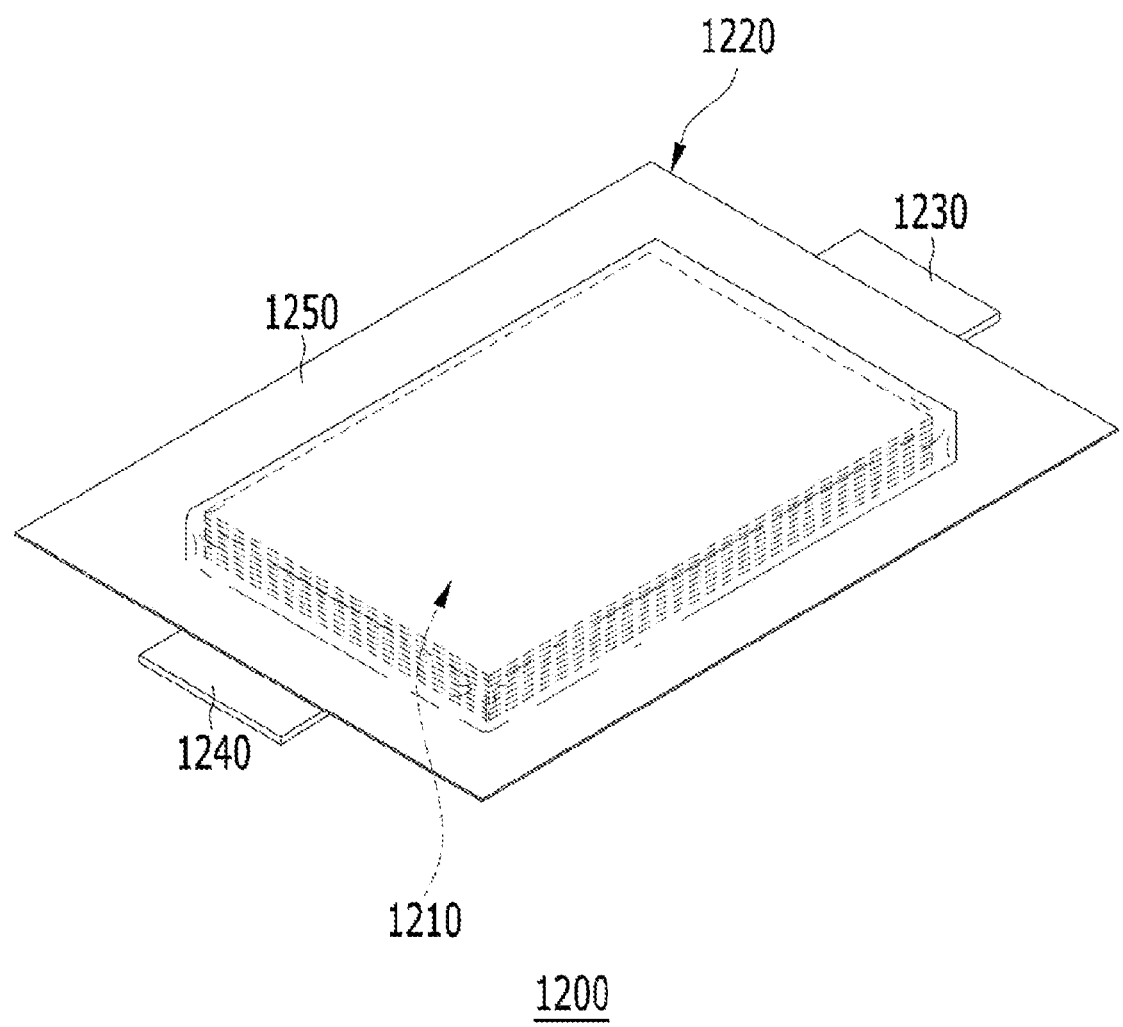
FIG. 12 is a perspective view illustrating an example of a secondary battery cell.

The present disclosure relates, inter alia, to an inspection system for inspecting a secondary battery cell, a method for controlling the same and a computer-readable storage medium storing a program. The inspection system according to the present disclosure may be configured to inspect various manufacturing characteristics of a secondary battery cell. Characteristics to be inspected by the inspection system according to the present disclosure include, for example, external characteristics regarding the shapes of electrode tabs, a terrace and a body of the secondary battery cell, physical characteristics such as the thickness, mass and strength of the secondary battery cell, and electrical characteristics such as various resistances, currents, voltages and capacitances of the secondary battery cell. FIG. 12 is a perspective view illustrating an example of a secondary battery cell to be inspected by the inspection system.

As shown in FIG. 12, a secondary battery cell 1200 is composed of an electrode assembly 1210 and a pouch case 1220.

Electrode assembly 1210 may be a stack-type electrode assembly in which a plurality of anode and cathode plates cut into units of a predetermined size is sequentially stacked with a separator interposed therebetween. An anode tab 1230 and a cathode tab 1240 of electrode assembly 1210 may oppose each other to be exposed at both sides of pouch case 1220. In secondary battery cell 1200 of another embodiment, anode tab 1230 and cathode tab 1240 of electrode assembly 1210 may be exposed at the same side. Hereafter, for the convenience of description, anode tab 1230 and cathode tab 1240 may be collectively referred to as electrode tabs.

Pouch case 1220 may be configured to accommodate electrode assembly 1210 and an electrolyte and may be sealed at the periphery thereof. The periphery of pouch case 1220 may be referred to as a sealing portion, and a portion of pouch case 1220 that corresponds to a region where electrode assembly 1210 and the electrolyte are accommodated may be referred to as a body. Also, in pouch case 1220, the sealing portion on both sides of pouch case 1220 where anode tab 1230 and cathode tab 1240 are not disposed may be referred to as a terrace 1250. Before folding terrace 1250 of secondary battery cell 1200, it is sealed along the periphery of pouch case 1220 after accommodating electrode assembly 1210 and the electrolyte, and then is cut to a predetermined size.

Figure 1:
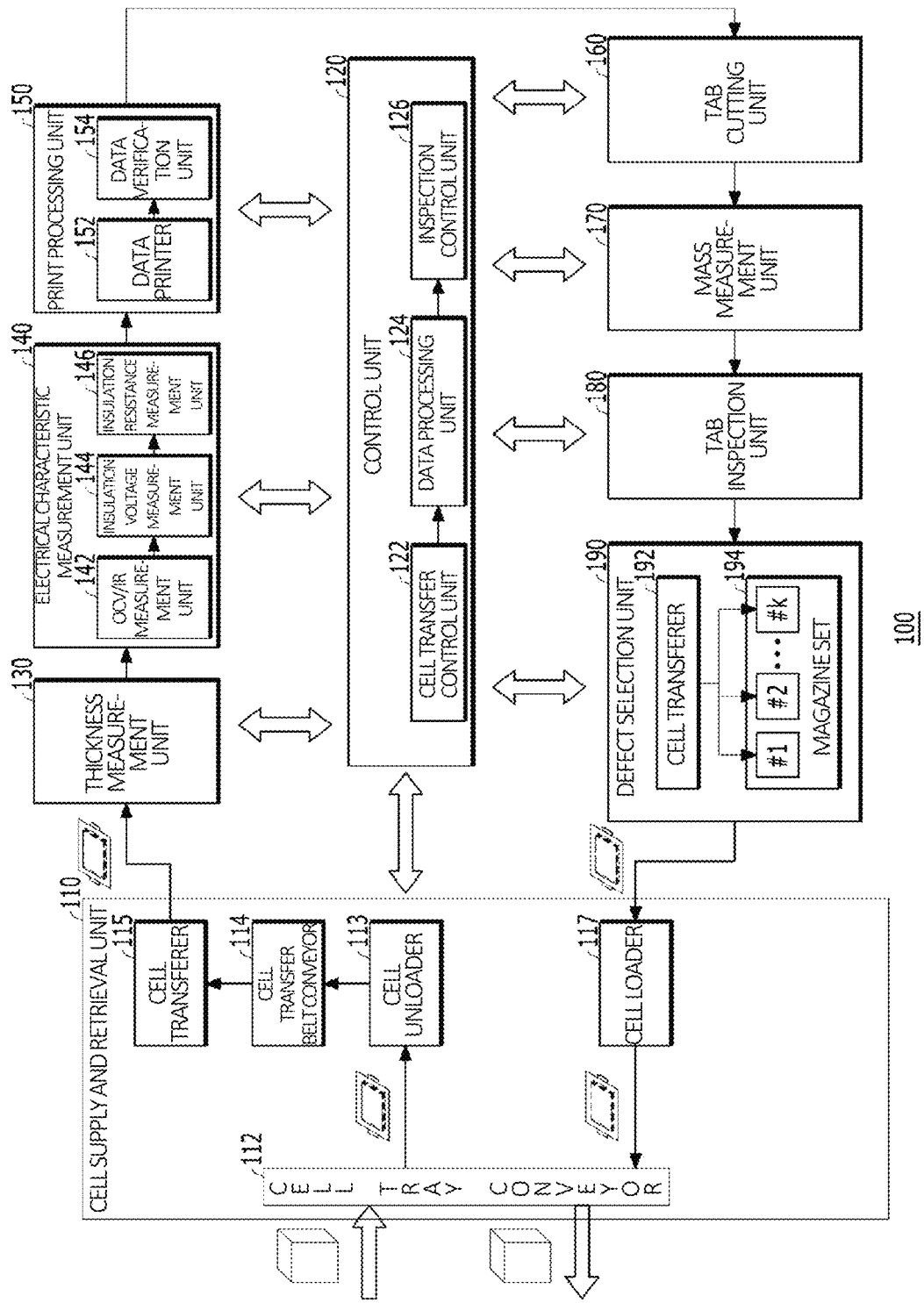
FIG. 1 is a schematic block diagram illustrating a configuration of an inspection system according to some embodiments of the present disclosure.

FIG. 1 is a schematic block diagram illustrating a configuration of an inspection system 100 according to some embodiments of the present disclosure. As shown in FIG. 1, inspection system 100 includes a cell supply and retrieval unit 110, a control unit 120, a thickness measurement unit 130, an electrical characteristic measurement unit 140, a print processing unit 150, a tab cutting unit 160, a mass measurement unit 170, a tab inspection unit 180 and a defect selection unit 190. Thickness measurement unit 130, electrical characteristic measurement unit 140, print processing unit 150, tab cutting unit 160, mass measurement unit 170 and tab inspection unit 180 are examples of an inspection unit. Accordingly, components 130, 140, 150, 160, 170 and 180 of the inspection unit can be arranged in a different order from the order shown in FIG. 1 without departing from the scope of the spirit of the present disclosure according to a required embodiment, for example, a required inspection order. Also, one or more components of the inspection unit can be combined, one component can be divided into one or more components, or one or more components can be omitted according to a required embodiment.

Secondary battery cells to be inspected in inspection system 100 are transferred in line. Accordingly, components 130, 140, 150, 160, 170 and 180 of the inspection unit of inspection system 100 and defect selection unit 190 are arranged in series. That is, the secondary battery cells are supplied into the inspection unit and sequentially inspected according to the arrangement order of components 130, 140, 150, 160, 170 and 180, and the inspected secondary battery cells are supplied into defect selection unit 190. Hereafter, for clarity of description, a process of inspecting secondary battery cells in the order shown in FIG. 1 will be described.

Control unit 120 controls various operations in inspection system 100, and receives and processes data. Accordingly, control unit 120 controls the in-line transfer of the plurality of secondary battery cells to be inspected and controls the respective operations of components 130, 140, 150, 160, 170 and 180 of the inspection unit and defect selection unit 190, and may process data from some components, for example, thickness measurement unit 130, electrical characteristic measurement unit 140, mass measurement unit 170 and tab inspection unit 180. In this regard, control unit 120 is operably linked to components 130, 140, 150, 160, 170 and 180 and defect selection unit 190. The operation and process of control unit 120 will be described in more detail below.

Cell supply and retrieval unit 110 supplies the secondary battery cells into the inspection unit and collects the secondary battery cells from defect selection unit 190. In some embodiments, cell supply and retrieval unit 110 includes a cell tray conveyor 112, a cell unloader 113, a cell transfer belt conveyor 114, a cell transferer 115 and a cell loader 117. Cell tray conveyor 112 is configured to transfer a cell tray capable of loading a plurality of secondary battery cells. When an operator of inspection system 100 supplies a cell tray for loading a plurality of secondary battery cells to an input port of cell tray conveyor 112, cell tray conveyor 112 may transfer the supplied cell tray along a conveyor line. Cell unloader 113 may unload a plurality of secondary battery cells from the cell tray transferred by cell tray conveyor 112, and put them down on cell transfer belt conveyor 114. Cell unloader 113 may place the unloaded plurality of secondary battery cells on cell transfer belt conveyor 114 at a predetermined interval in a predetermined direction. Cell transferer 115 may transfer the plurality of secondary battery cells placed on cell transfer belt conveyor 114 from cell transfer belt conveyor 114 to thickness measurement unit 130.

Thickness measurement unit 130 may be configured to measure the thickness of each of the plurality of secondary battery cells. In some examples, thickness measurement unit 130 is equipped with a plurality of measurement units connected in a line and thus may measure the thicknesses of the plurality of secondary battery cells in one measurement operation. In one embodiment, thickness measurement unit 130 may measure the thicknesses of four secondary battery cells in one measurement cycle. In some examples, thickness measurement unit 130 may include a pressing plate for pressing a body of a secondary battery cell in a vertical direction and a plurality of gauge pins for measuring a plurality of points on a surface of the pressing plate opposing a contact surface with the secondary battery cell. In some examples, each gauge pin may include a linear variable differential transformer (LVDT) that measures a linear distance difference. In some examples, thickness measurement unit 130 may determine the thickness of the secondary battery cell by measuring an average of a plurality of values obtained from the plurality of points. In some other examples, thickness measurement unit 130 may calculate the thickness of the cell by calculating and using values such as deviation and dispersion of a plurality of values obtained from a specific point (e.g., a center point). A specific embodiment of thickness measurement unit 130 will be described in more detail with reference to FIG. 2.

Electrical characteristic measurement unit 140 measures electrical characteristics of a secondary battery cell. In some embodiments, electrical characteristic measurement unit 140 may include an open circuit voltage/impedance reactance (OCV/IR) measurement unit 142, an insulation voltage measurement unit 144 and an insulation resistance measurement unit 146. Secondary battery cells may be sequentially transferred to OCV/IR measurement unit 142, insulation voltage measurement unit 144 and insulation resistance measurement unit 146 so that a plurality of electrical characteristics of the secondary battery cells can be measured. Each of OCV/IR measurement unit 142, insulation voltage measurement unit 144 and insulation resistance measurement unit 146 includes a plurality of measurement units for measuring corresponding electrical characteristics and thus can measure electrical characteristics of a plurality of secondary battery cells in one measurement cycle. In one embodiment, each of OCV/IR measurement unit 142, insulation voltage measurement unit 144 and insulation resistance measurement unit 146 may measure two secondary battery cells in one measurement operation.

OCV/IR measurement unit 142 may measure a no-load potential and an internal impedance of the secondary battery cell. In some examples, OCV/IR measurement unit 142 may include sensing grippers and may perform a measurement by contacting the sensing gripper with two electrode tabs (i.e., an anode tab and a cathode tab) of the secondary battery cell. In some examples, a measurement may be performed when the contact of the sensing grippers of OCV/IR measurement unit 142 causes intentional damage the electrode tabs in order to apply an external resistance. A specific embodiment of OCV/IR measurement unit 142 will be described in more detail with reference to FIG. 3.

Insulation voltage measurement unit 144 may measure the insulation voltage of the secondary battery cell. The insulation voltage can be used to determine the internal state of the secondary battery and whether it is defective. In some examples, insulation voltage measurement unit 144 may include sensing grippers and may perform a measurement by contacting the sensing grippers with the anode tab and a terrace of the secondary battery cell. In some examples, the contact of the sensing grippers of insulation voltage measurement unit 144 may be performed without damaging the electrode tabs. A mechanical embodiment of insulation voltage measurement unit 144 will be described in more detail with reference to FIG. 4.

Insulation resistance measurement unit 146 may measure the insulation resistance of the secondary battery cell. The insulation resistance can be used to determine the internal state of the secondary battery and whether it is defective. In some examples, insulation resistance measurement unit 146 may include sensing grippers and may perform a measurement by contacting the sensing grippers with the cathode tab and the terrace of the secondary battery cell. In some examples, the contact of the sensing grippers of insulation resistance measurement unit 146 may be performed without damaging the electrode tabs. A specific embodiment of insulation resistance measurement unit 146 will be described in more detail with reference to FIG. 5.

The plurality of secondary battery cells whose electrical characteristics have been measured by electrical characteristic measurement unit 140 is transferred to print processing unit 150. Print processing unit 150 may include a data printer 152 and a data verification unit 154. Data printer 152 may print information about a secondary battery cell on a surface of the secondary battery cell, for example, a surface of a body of the secondary battery cell. The printed information may include at least some of information measured by thickness measurement unit 130 and electrical characteristic measurement unit 140, and may take the form of text and/or encoded code such as quick response (QR) code and barcode. Data printer 152 may print information on a plurality of secondary battery cells at the same time by using a multi-head marking printer. In one embodiment, data printer 152 may perform printing on four secondary battery cells in one printing cycle by using a four-head marking printer. A specific embodiment of data printer 152 will be described in more detail with reference to FIG. 6. Data verification unit 154 may verify whether printing is correctly performed by reading the data printed by print processing unit 150. In some embodiments, data verification unit 154 may include an optical reader for reading the printed information. Since the secondary battery cells are transferred in line within inspection system 100, the optical reader needs to read the information printed on the secondary battery cells being transferred. Accordingly, the optical reader is inclined at a predetermined angle with respect to a transfer direction of the secondary battery cells. According to the ISO standard documents and AIM guidelines, the optical reader is required to have a light source angle of 45 degrees. However, it was found that if the optical reader is set to the standard angle, data can be read only when the optical reader (light source or camera) is very close to the secondary battery cells, and it is difficult to apply the standard angle to the inspection system adopting an in-line process because diffused reflection occurs depending on material characteristics of the pouch. In the inline process, it is preferable to apply a predetermined angle higher than the standard angle according to the ISO standard documents and AIM guidelines. In one embodiment, the predetermined inclination angle of the optical reader may be, for example, about 60 degrees. A specific embodiment of data verification unit 154 will be described in more detail with reference to FIG. 7.

The plurality of secondary battery cells is transferred from print processing unit 150 to tab cutting unit 160. Tab cutting unit 160 may cut the electrode tabs of each of the plurality of secondary battery cells to a predetermined size. In some examples, tab cutting unit 160 is equipped with a plurality of cutting units connected in a line and thus may cut the electrode tabs of the plurality of secondary battery cells in one cutting cycle. Also, tab cutting unit 160 may be equipped with at least one cutting unit for each of the cathode tab and the anode tab as required. In one embodiment, tab cutting unit 160 may include two cutting apparatuses for each of the anode tab and the cathode tab. In some examples, tab cutting unit 160 may include an upper cutter and a lower cutter that are replaceably fixed. In some examples, the upper cutter and the lower cutter may have cutting blades at two facing edges, respectively. When the life of any one blade ends, the upper cutter and/or the lower cutter may use the opposing blade of the upper cutter and/or the lower cutter. Accordingly, at least one of the upper cutter and the lower cutter may have a vertically symmetrical shape. Tab cutting unit 160 may further include an air blower provided in at least one of a region where the upper cutter is fixed and a region where the lower cutter is fixed. Tab cutting unit 160 may remove cutting residues attached to tab cutting unit 160 by using the air blower whenever a cutting operation is performed. A specific embodiment of tab cutting unit 160 will be described in more detail with reference to FIG. 8.

The plurality of secondary battery cells is transferred from tab cutting unit 160 to mass measurement unit 170. Mass measurement unit 170 may measure the mass of each of the plurality of secondary battery cells. In some examples, mass measurement unit 170 may measure the mass of a secondary battery cell whose electrode tabs have been cut. In some examples, since the mass of the secondary battery cell may be measured differently depending on the direction and position of the secondary battery cell, mass measurement unit 170 may measure the secondary battery cell after aligning the direction and position. In some examples, mass measurement unit 170 is equipped with a plurality of measurement units connected in a line and thus may measure the mass of the plurality of secondary battery cells in one measurement cycle. In one embodiment, mass measurement unit 170 may measure the mass of two secondary battery cells in one measurement cycle. A specific embodiment of mass measurement unit 170 will be described in more detail with reference to FIG. 9.

Tab inspection unit 180 may obtain a cut shape of the electrode tabs of each of the plurality of secondary battery cells. Tab inspection unit 180 may perform a vision inspection on the length and shape of the electrode tabs cut by tab cutting unit 160. A specific embodiment of tab inspection unit 180 will be described in more detail with reference to FIG. 10. Defect selection unit 190 may select some defective secondary battery cells among the plurality of secondary battery cells and may transfer non-defective secondary battery cells to cell loader 117 of cell supply and retrieval unit 110. In some examples, defect selection unit 190 may include a cell transferer 192 and a magazine set 194 including a plurality of magazines #1, #2, . . . , #k (k is a natural number). Each of the plurality of magazines #1, #2, . . . , #k of magazine set 194 may store one or more secondary battery cells. Cell transferer 192 may identify each of the plurality of secondary battery cells that have passed through the inspection unit 130, 140, 150, 160, 170 and 180 and may select some defective secondary battery cells among the identified plurality of secondary battery cells. Cell transferer 192 may transfer the selected secondary battery cells to a corresponding magazine of magazine set 194 and store them. In some examples, cell transferer 192 may identify the type of a defect of a secondary battery cell and may transfer the secondary battery cell to a predetermined magazine corresponding to the type of the defect. A specific embodiment of defect selection unit 190 will be described in more detail with reference to FIG. 11.

In some examples, cell loader 117 of cell supply and retrieval unit 110 may load the secondary battery cells, which have not been selected by defect selection unit 190, onto the cell tray. Cell supply and retrieval unit 110 may operate to cause cell tray conveyor 112 to discharge the cell tray on which the non-defective secondary battery cells are loaded.

In some embodiments, control unit 120 may include a cell transfer control unit 122, a data processing unit 124 and an inspection control unit 126. Cell transfer control unit 122 may control a transfer of secondary battery cells throughout inspection system 100. The transfer controlled by cell transfer control unit 122 includes not only the transfer of the secondary battery cells, but also the transfer of the cell tray by cell tray conveyor 112. Further, the transfer controlled by cell transfer control unit 122 includes the transfer to cell supply and retrieval unit 110, the transfer to components 130, 140, 150, 160, 170 and 180 of the inspection unit and the transfer to cell supply and retrieval unit 110 through defect selection unit 190. Furthermore, the transfer controlled by cell transfer control unit 122 may include a continuous transfer that does not require synchronization, e.g., the transfer by cell transfer belt conveyor 114 as well as a control of synchronization throughout components 130, 140, 150, 160, 170 and 180 of the inspection unit.

Data processing unit 124 may receive data measured from thickness measurement unit 130, OCV/IR measurement unit 142, insulation voltage measurement unit 144 and insulation resistance measurement unit 146 of electrical characteristic measurement unit 140, mass measurement unit 170 and tab inspection unit 180, and may appropriately process the data if required. In one example, data processing unit 124 may encode data received from thickness measurement unit 130 and electrical characteristic measurement unit 140 (e.g., in the case of a barcode or QR code) or may perform other appropriate processes to produce data to be printed by data printer 150. In another example, data processing unit 124 may determine whether a secondary battery cell is defective based on the data measured from thickness measurement unit 130, OCV/IR measurement unit 142, insulation voltage measurement unit 144 and insulation resistance measurement unit 146 of electrical characteristic measurement unit 140, mass measurement unit 170 and tab inspection unit 180. In this example, cell transferer 192 may identify a secondary battery cell and may determine whether the identified secondary battery cell is defective by obtaining a defect determination result made by data processing unit 124.

Inspection control unit 126 may control the respective operations of components 130, 140, 150, 160, 170 and 180 of the inspection unit and defect selection unit 190. Inspection control unit 126 may control measurement operations of thickness measurement unit 130, OCV/IR measurement unit 142, insulation voltage measurement unit 144 and insulation resistance measurement unit 146 of electrical characteristic measurement unit 140, data verification unit 154, mass measurement unit 170 and tab inspection unit 180. Inspection control unit 126 may control a printing operation of data printer 152, a cutting operation of tab cutting unit 160 and a cell transfer operation of cell transferer 192.

As described above, inspection system 100 according to the present disclosure can perform various inspections, print inspection data and discharge defective cells in line and can adjust the throughput depending on operation cycle. Therefore, inspection system 100 can improve the inspection efficiency of secondary batteries.

Figure 2:
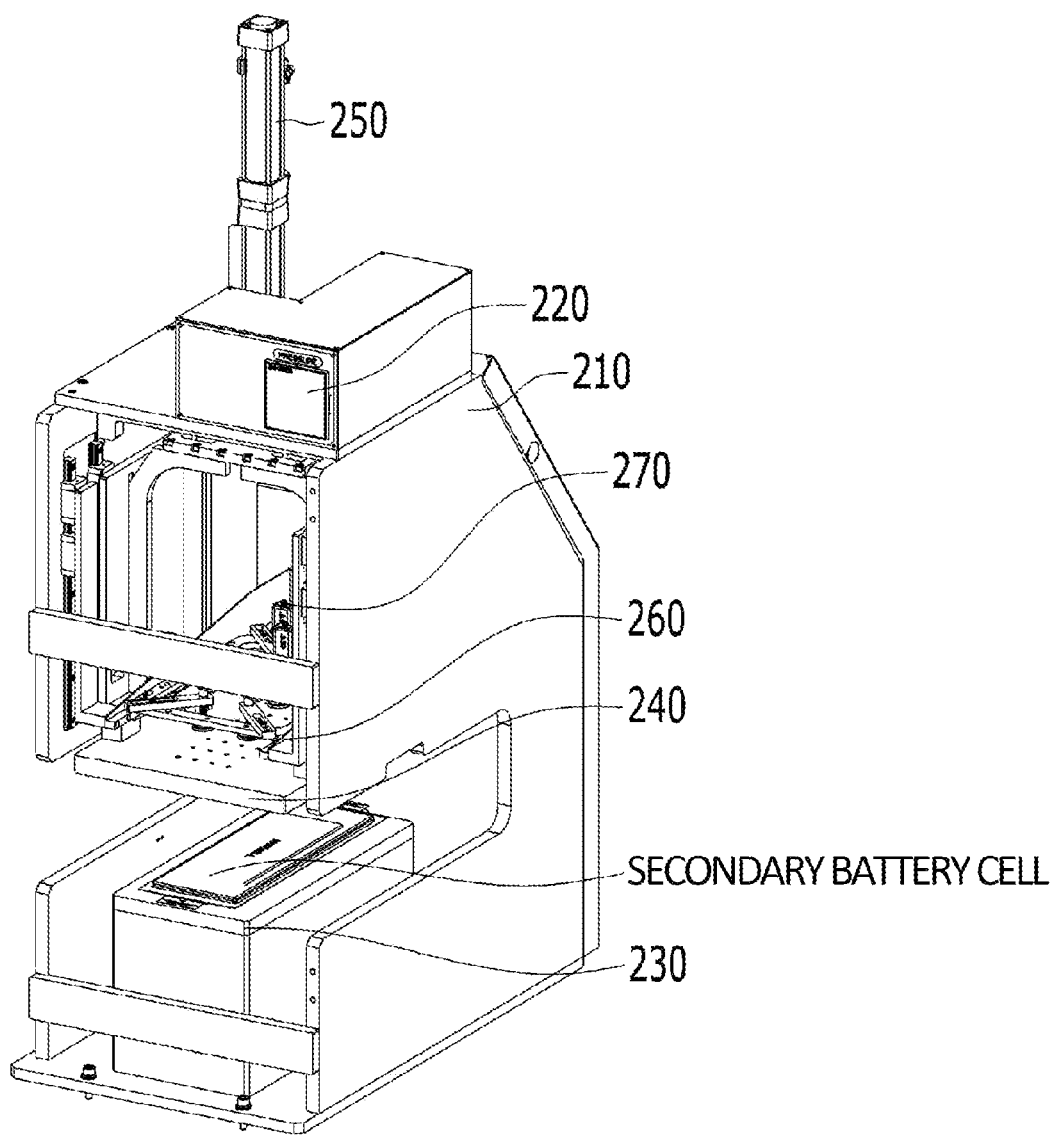
FIG. 2 is a perspective view illustrating a thickness measurement apparatus according to an embodiment of the present disclosure.

FIG. 2 is a perspective view illustrating a thickness measurement apparatus 200 according to an embodiment of the present disclosure. Thickness measurement apparatus 200 is an example of thickness measurement unit 130 shown in FIG. 1. In FIG. 2, thickness measurement apparatus 200 is illustrated as having one measurement unit, but in another example, thickness measurement apparatus 200 may include a plurality of measurement units and measure the thickness of a plurality of secondary battery cells in one measurement operation. Thickness measurement apparatus 200 may include a main body 210, a display 220, a cell support 230, a pressing plate 240, a pressing plate driver 250, a plurality of gauge pins 260 and a gauge pin driver 270. Main body 210 may provide a space where the other components 220 to 270 of thickness measurement apparatus 200 are installed. Display 220 may display the measurement result of thickness of the secondary battery cells. Cell support 230 provides a placing surface on which a secondary battery cell to be inspected is placed. In some examples, thickness measurement apparatus 200 may be configured to adjust the position of the secondary battery cell placed on cell support 230.

Pressing plate 200 may press or contact an upper surface of the secondary battery cell placed on cell support 230 at a predetermined pressure or less by an operation of pressing plate driver 250. Thereafter, the plurality of gauge pins 260 may be operated by gauge pin driver 270 to measure a plurality of points on a surface of pressing plate 200 opposing a contact surface with the secondary battery cell. In one example, the plurality of gauge pins 260 may perform a measurement from at least five points, such as the center, upper left, lower left, upper right and lower right of the secondary battery cell, but the number of measurement points is not limited thereto. In some examples, each gauge pin 260 may include a linear variable differential transformer (LVDT) that is an electrical transformer for measuring a linear distance difference. In some examples, thickness measurement apparatus 200 may determine the thickness of the secondary battery cell by measuring an average of a plurality of values obtained from the plurality of points by the plurality of gauge pins 260. In some other examples, thickness measurement apparatus 200 may calculate the thickness of the cell by calculating and using values such as deviation and dispersion of a plurality of values obtained from a specific point (e.g., a center point).

Figure 3:
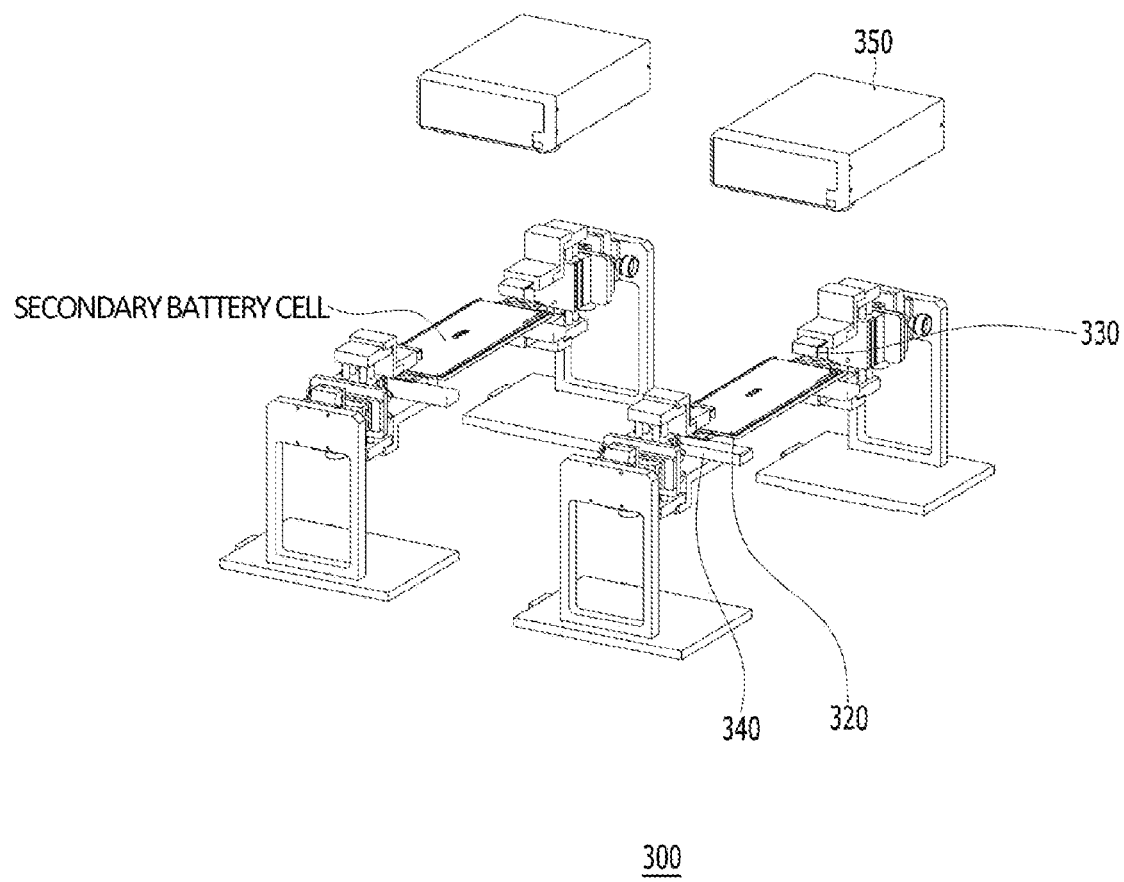
FIG. 3 is a perspective view illustrating an OCV/IR measurement apparatus according to an embodiment of the present disclosure.

FIG. 3 is a perspective view illustrating an OCV/IR measurement apparatus 300 according to an embodiment of the present disclosure. OCV/IR measurement apparatus 300 is an example of OCV/IR measurement unit 142 shown in FIG. 1. OCV/IR measurement apparatus 300 may include two measurement units as shown in FIG. 3, and each unit performs the same function. OCV/IR measurement apparatus 300 may include a cell support 320, a sensing gripper 330, a sensing gripper driver 340 and a measuring instrument 350. Measuring instrument 350 may be provided in a non-illustrated frame. Cell support 320 may be configured to place thereon a secondary battery cell to be inspected. When the secondary battery cell is placed, sensing gripper driver 340 may operate to cause sensing gripper 330 to contact electrode tabs of the secondary battery cell. Sensing gripper 330 may contact two electrode tabs (i.e., an anode tab and a cathode tab) of the secondary battery cell. The contact of sensing gripper 330 may cause intentional damage the electrode tabs of the secondary battery cell in order to apply an intentional external resistance during a measurement on the secondary battery cell. A value measured by the operation of OCV/IR measurement apparatus 300 may include values caused by DC power, such as an open circuit voltage (OCV) of the secondary battery cell, and values caused by AC power, such as impedance (Z) and reactance (X). The value measured by the operation of OCV/IR measurement apparatus 300 can be used to determine the internal state of the secondary battery and whether it is defective. Measuring instrument 350 may output a measurement value using a value measured by the contact between the secondary battery cell and sensing gripper 330. In one embodiment, for example, the HIOKI BT3562 BATTERY HiTester may be used as measuring instrument 350.

Figure 4:
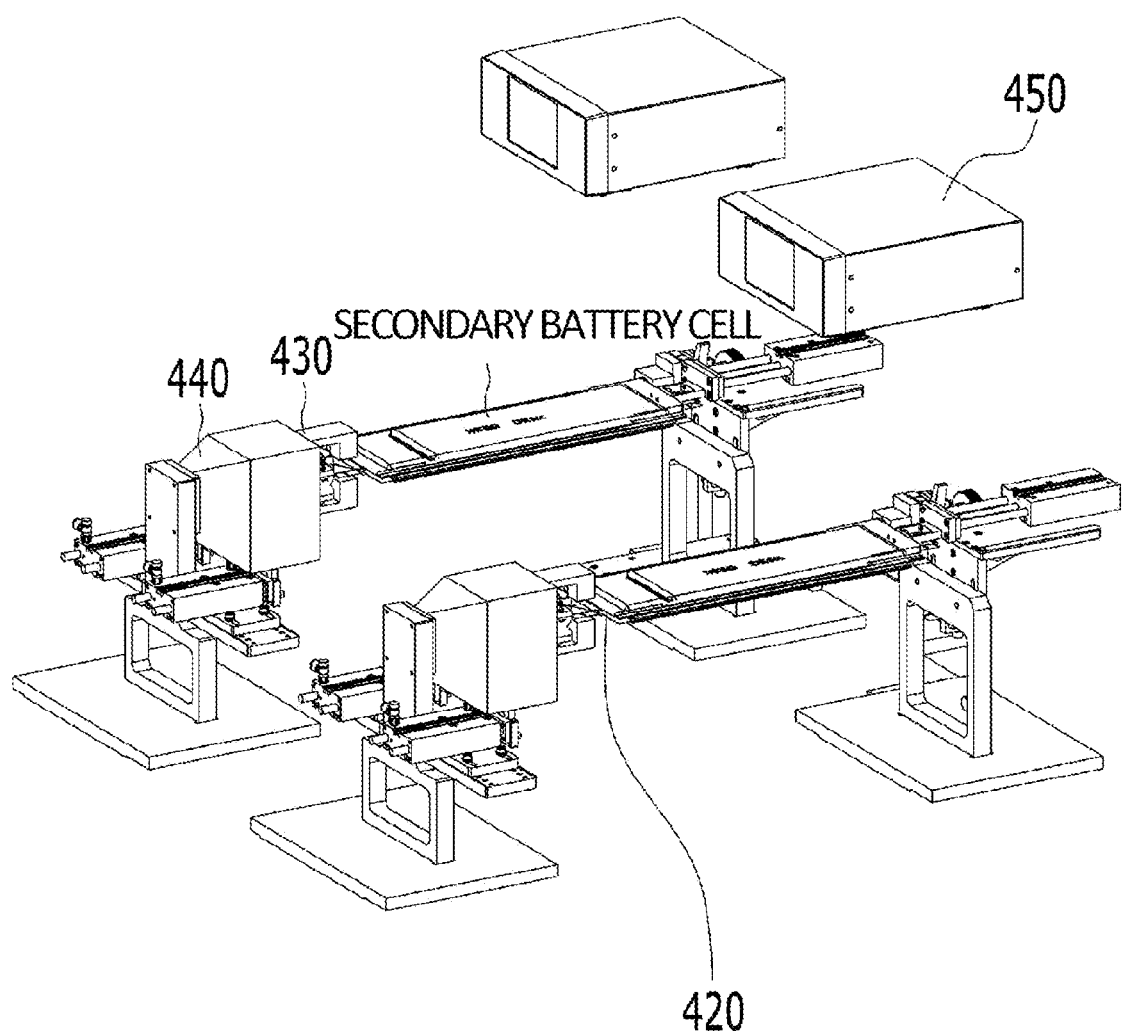
FIG. 4 is a perspective view illustrating an insulation voltage measurement apparatus according to an embodiment of the present disclosure.

FIG. 4 is a perspective view illustrating an insulation voltage measurement apparatus 400 according to an embodiment of the present disclosure. Insulation voltage measurement apparatus 400 is an example of insulation voltage measurement unit 144 shown in FIG. 1. As shown in FIG. 4, insulation voltage measurement apparatus 400 may include two measurement units, and each unit performs the same function. Insulation voltage measurement apparatus 400 may include a cell support 420, a sensing gripper 430, a sensing gripper driver 440 and a measuring instrument 450. Measuring instrument 450 may be provided in a non-illustrated frame. Cell support 420 may be configured to place thereon a secondary battery cell to be inspected. When the secondary battery cell is placed, sensing gripper driver 440 may operate to cause sensing gripper 430 to contact an anode tab and a terrace of the secondary battery cell (or another part of a pouch of the secondary battery cell). Sensing gripper 430 may contact the anode tab and the terrace of the secondary battery cell without any physical damage. Insulation voltage measurement apparatus 400 is configured to measure a voltage between two points contacted by sensing gripper 430. If the measured value does not come out or is equal to or less than a predetermined value (e.g., equal to or less than 0.5 V), it may be considered normal. The value measured by the operation of insulation voltage measurement apparatus 400 can be used to determine the internal state of the secondary battery and whether it is defective. Measuring instrument 450 may output a measurement value using a value measured by the contact between the secondary battery cell and sensing gripper 430. In one embodiment, for example, the HIOKI DM7275-03 PRECISION DC VOLTMETER may be used as measuring instrument 450.

Figure 5:
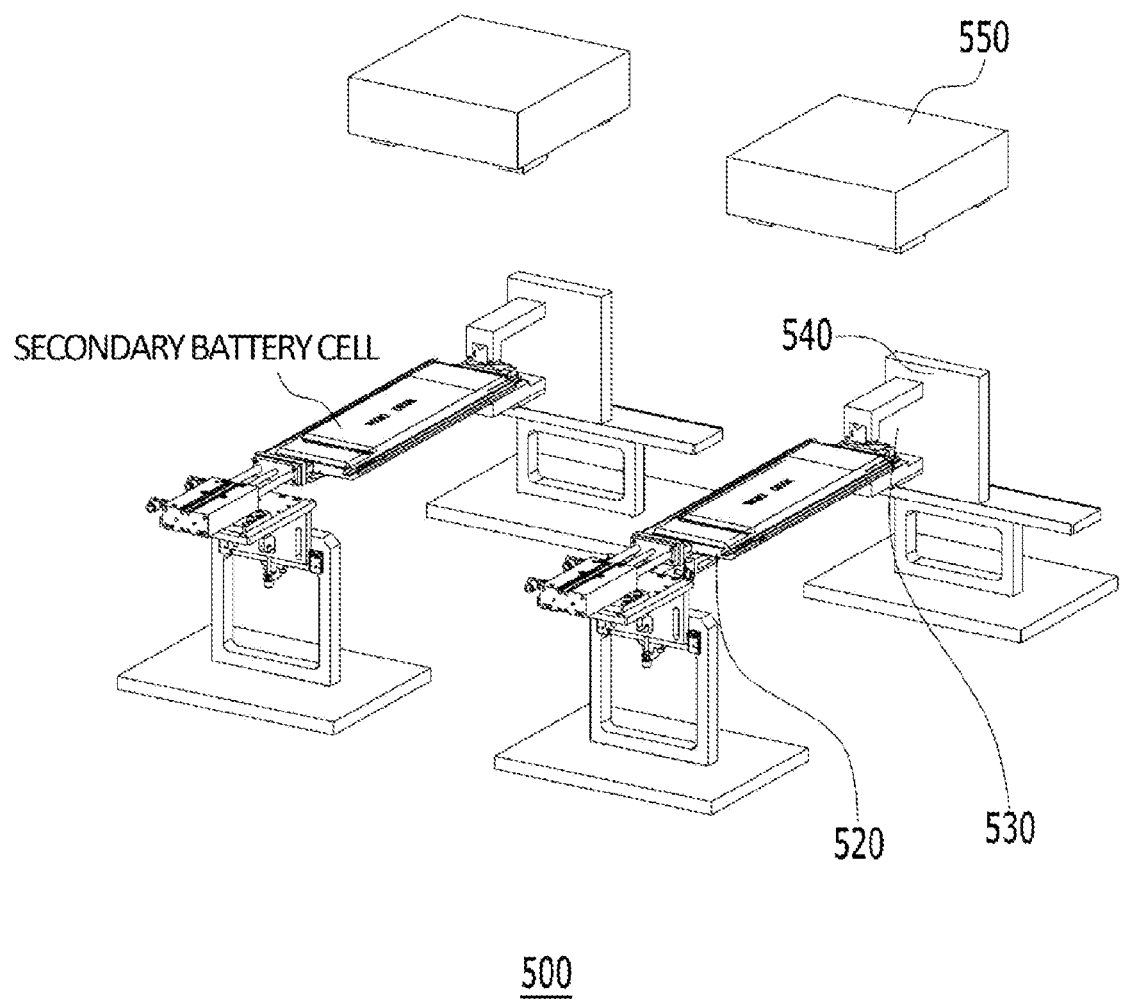
FIG. 5 is a perspective view illustrating an insulation resistance measurement apparatus according to an embodiment of the present disclosure.

FIG. 5 is a perspective view illustrating an insulation resistance measurement apparatus 500 according to an embodiment of the present disclosure. Insulation resistance measurement apparatus 500 is an example of insulation resistance measurement unit 146 shown in FIG. 1. As shown in FIG. 5, insulation resistance measurement apparatus 500 may include two measurement units, and each unit performs the same function. Insulation resistance measurement apparatus 500 may include a cell support 520, a sensing gripper 530, a sensing gripper driver 540 and a measuring instrument 550. Measuring instrument 550 may be provided in a non-illustrated frame. Cell support 520 may be configured to place thereon a secondary battery cell to be inspected. In some examples, when the secondary battery cell is placed, sensing gripper driver 540 may operate to cause sensing gripper 530 to contact a cathode tab and a terrace of the secondary battery cell (or another part of a pouch of the secondary battery). Sensing gripper 530 may contact the cathode tab and the terrace of the secondary battery cell without any physical damage. Insulation resistance measurement apparatus 500 is configured to measure a resistance between two points contacted by sensing gripper 530. If the measured value does not come out or is equal to or more than a predetermined value (e.g., equal to or more than 100 MΩ to 200 MΩ), it may be considered normal. In some other examples, sensing gripper driver 540 may operate to cause sensing gripper 530 to contact two end surfaces of the terrace. In these examples, if a resistance value measured by insulation resistance measurement apparatus 500 is equal to or less than a predetermined value (e.g., equal to less than 0.5Ω), it may be considered normal. The value measured by the operation of insulation resistance measurement apparatus 500 can be used to determine the internal state of the secondary battery and whether it is defective.

Measuring instrument 550 may output a measurement value using a value measured by the contact between the secondary battery cell and sensing gripper 530. In one embodiment, for example, the HIOKI ST5520-S INSULATION TESTER may be used as measuring instrument 550.

Figure 6:
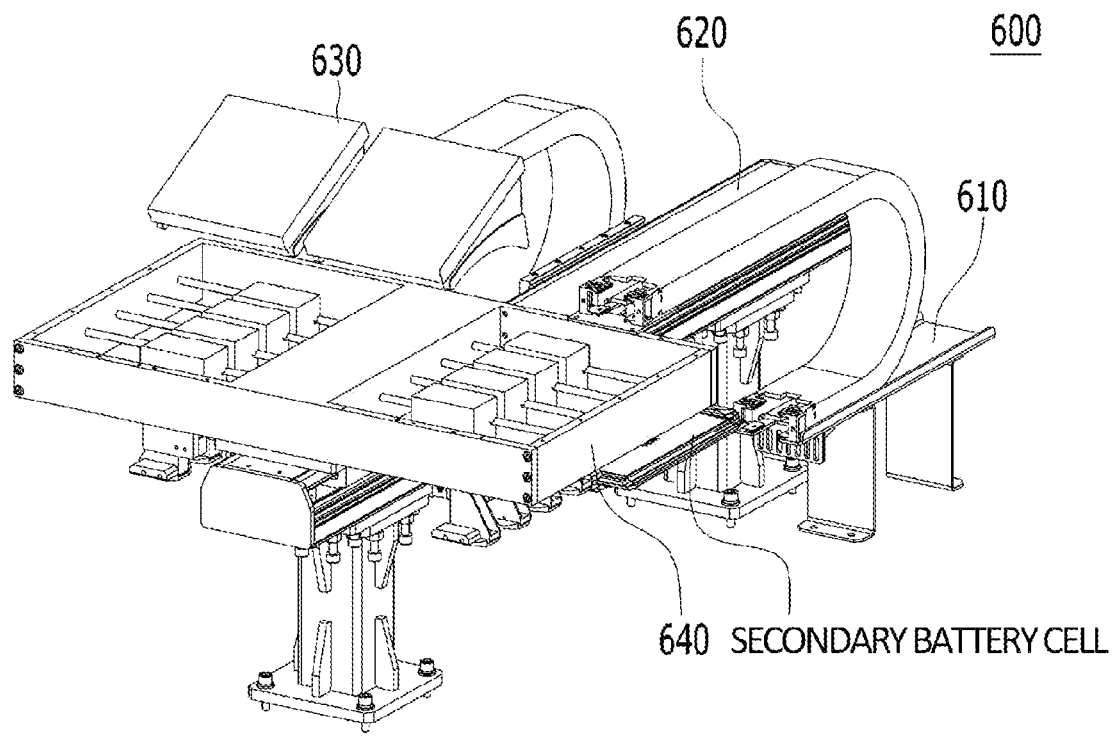
FIG. 6 is a perspective view illustrating a data printer according to an embodiment of the present disclosure.

FIG. 6 is a perspective view illustrating a data printer 600 according to an embodiment of the present disclosure. Data printer 600 is an example of data printer 152 shown in FIG. 1. As shown in FIG. 6, data printer 600 may include a main body 610, an orthogonal robot 620, a marking controller 630 and a multi-head marking printer 640. Main body 610 may include a frame capable of supporting the other components 620 to 640 of data printer 600. Orthogonal robot 620 may move multi-head marking printer 640 under the control of marking controller 630. Marking controller 630 may control an operation of orthogonal robot 620 and an operation of multi-head marking printer 640, and may be provided in a non-illustrated frame or fixed element. Multi-head marking printer 640 may include a plurality of cartridges, and may include a driver for moving each cartridge. Each cartridge may print information about a secondary battery cell on a surface of a body of the secondary battery cell. The printed information may take the form of text and/or encoded code such as QR code, data matrix code (DMC) and barcode. In this way, the multi-head marking printer can print information on a plurality of secondary battery cells at the same time. In one example, multi-head marking printer 640 may be a four-head marking printer, which may perform printing on four secondary battery cells in one printing cycle. In one embodiment, the MARK-O-PRINT X4JET may be used as multi-head marking printer 640. In some additional examples, data printer 600 may further include an ink purge box (not shown). The ink purge box may accommodate ink residues discharged after multi-head marking printer 640 performs printing.

Figures 7A, 7B:
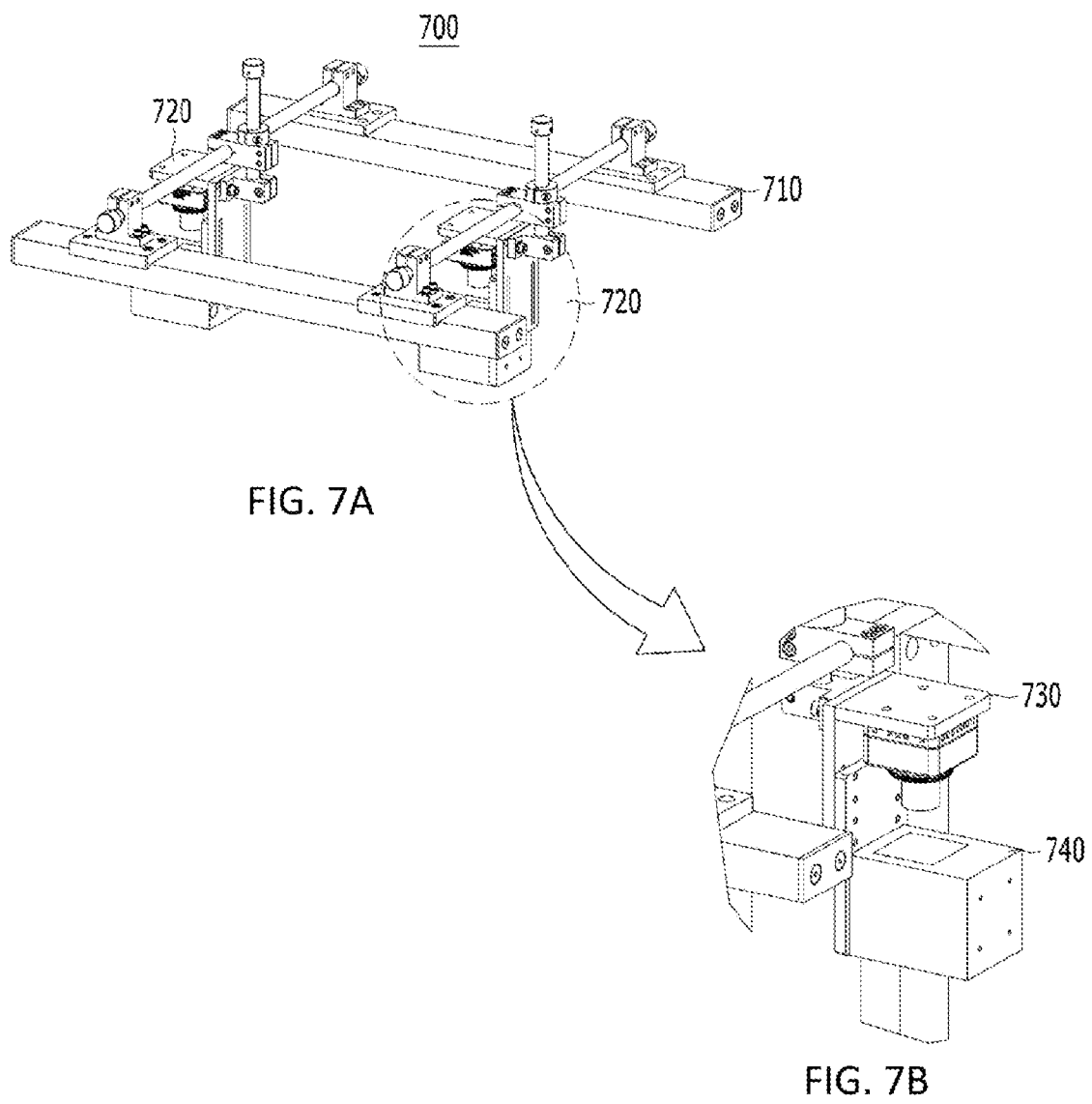
FIG. 7A is a perspective view illustrating a data verification apparatus according to an embodiment of the present disclosure.
FIG. 7B is an enlarged partial view of an optical reader of the data verification apparatus.

FIG. 7A is a perspective view illustrating a data verification apparatus 700 according to an embodiment of the present disclosure, and FIG. 7B is an enlarged partial view of an optical reader 720 of data verification apparatus 700. Data verification apparatus 700 is an example of data verification unit 154 shown in FIG. 1. A main body 710 may include a frame capable of supporting optical reader 720 of data verification apparatus 700. For example, data verification apparatus 700 includes two optical readers 720 as shown in FIG. 7A, and each optical reader 720 performs the same function. Therefore, data verification apparatus 700 may verify data printed on two secondary battery cells in one measurement cycle. Each optical reader 720 may include an optical camera 730 and an optical lens 740 as shown in FIG. 7B, and may further include an illumination device and a display device which are not illustrated in FIG. 7B. Optical reader 720 may check whether data printed on a plurality of (e.g., two) secondary battery cells being transferred in line are correctly printed. For example, optical reader 720 may determine whether there is a defect in data printed on a surface of a secondary battery cell. Optical camera 730 of optical reader 720 may be inclined at a predetermined angle, for example, about 60 degrees with respect to a transfer direction of the secondary battery cell. In one embodiment, a C-Mount Vision Hawk camera (MV4000-13) may be used as optical camera 730 of optical reader 720.

Figure 8:
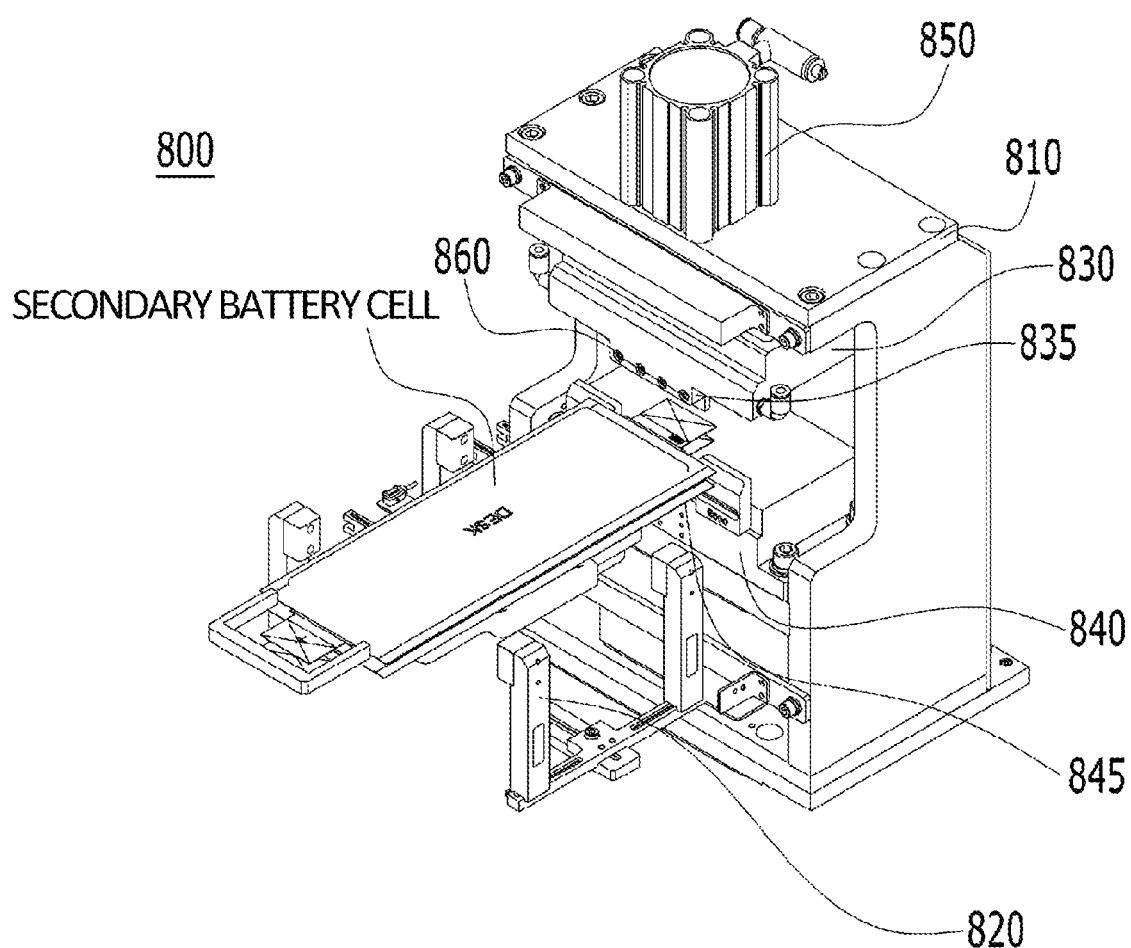
FIG. 8 is a perspective view illustrating a tab cutting apparatus according to an embodiment of the present disclosure.

FIG. 8 is a perspective view illustrating a tab cutting apparatus 800 according to an embodiment of the present disclosure. Tab cutting apparatus 800 is an example of tab cutting unit 160 shown in FIG. 1. Accordingly, tab cutting apparatus 800 may cut an electrode tab, i.e., an anode tab or a cathode tab, of a transferred secondary battery cell to a predetermined size. As shown in FIG. 8, tab cutting apparatus 800 may include a main body 810, a cell alignment unit 820, a moving frame 830, an upper cutter 835, a fixing frame 840, a lower cutter 845 and a moving frame driver 850. Main body 810 includes a frame for arranging the other components 820 to 850 of tab cutting apparatus 800.

Cell alignment unit 820 is configured to align the secondary battery cell before the electrode tab of the secondary battery cell is cut by tab cutting apparatus 800. In some examples, the secondary battery cell may be placed on cell alignment unit 820 by a separate device such as a cell transferer (not shown), and may be aligned by cell alignment unit 820. Moving frame 830 may include an upper cutter holder for holding upper cutter 835 and a guide bar for vertical movement. Fixing frame 840 may include a lower cutter holder for holding lower cutter 845. In this way, upper cutter 835 and lower cutter 845 may be replaceably mounted on moving frame 830 and fixing frame 840. In some examples, upper cutter 835 and lower cutter 845 may have cutting blades at two facing edges, respectively. Accordingly, upper cutter 835 and lower cutter 845 may be vertically symmetrical to each other. In some examples, a surface of upper cutter 835 in contact with moving frame 830 may be aligned a surface of lower cutter 845 in contact with fixing frame 840.

In an additional example, tab cutting apparatus 800 may further include an air blower 860. Air blower 860 may be formed at moving frame 830 as shown in FIG. 8, but is not limited thereto and may be formed at fixing frame 840. Air blower 860 may remove cutting residues that may be attached to upper cutter 835 and/or lower cutter 845 when cutting is performed by tab cutting apparatus 800.

Figure 9:
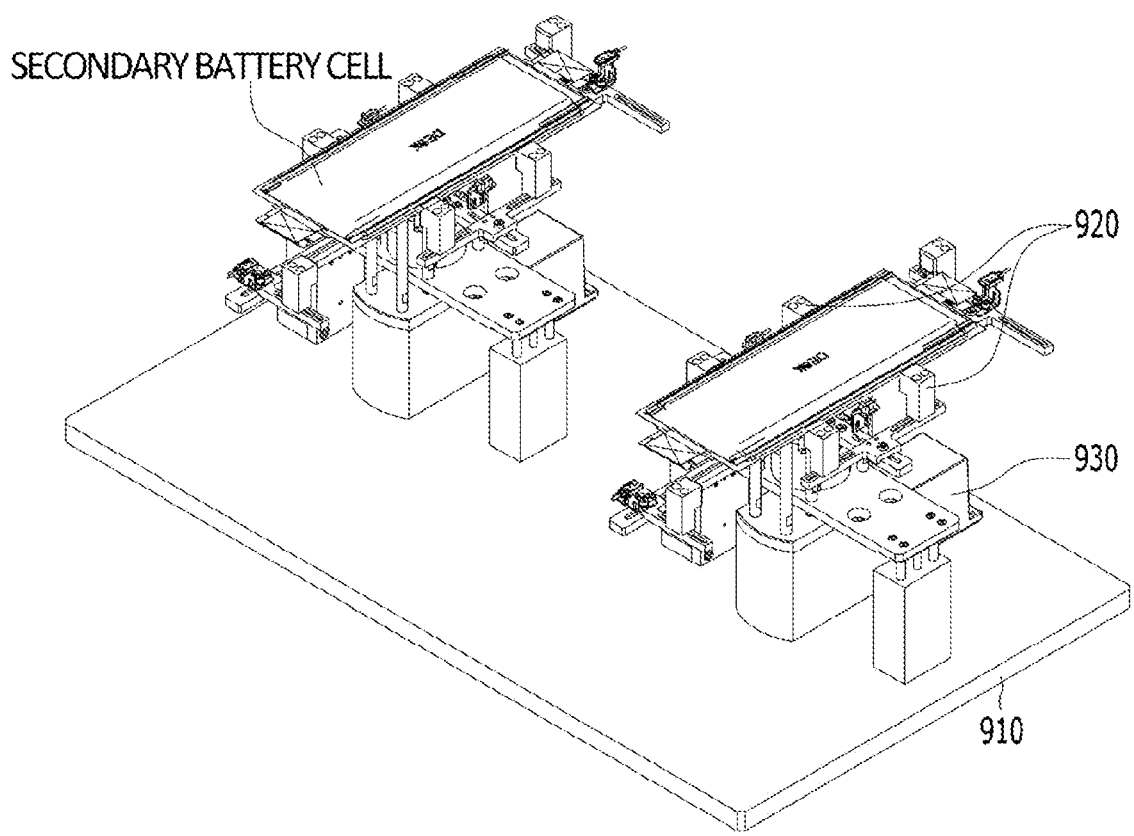
FIG. 9 is a perspective view illustrating a mass inspection apparatus according to an embodiment of the present disclosure.

FIG. 9 is a perspective view illustrating a mass inspection apparatus 900 according to an embodiment of the present disclosure. Mass inspection apparatus 900 is an example of mass measurement unit 170 shown in FIG. 1. As shown in FIG. 9, mass inspection apparatus 900 may include two measurement units, and each unit performs the same function. Mass inspection apparatus 900 may include a main body 910, a cell alignment unit 920 and a mass meter 930. Main body 910 may provide a space where the other components 920 to 930 of mass inspection apparatus 900 are installed, and may include a frame. Cell alignment unit 920 may be configured to place and align a secondary battery cell to be inspected. The alignment of the secondary battery cell may be based on the type of the secondary battery cell. In some examples, cell alignment unit 920 may perform alignment of the secondary battery cell independently of measurement by mass meter 930. In some examples, the secondary battery cell may be placed on cell alignment unit 920 by a separate device such as a cell transferer (not shown). When the secondary battery cell is placed on cell alignment unit 920, cell alignment unit 920 aligns the secondary battery cell while mass meter 930 measures the mass of the secondary battery cell. The mass measured by mass meter 930 may be displayed on a display unit (not shown).

Figure 10:
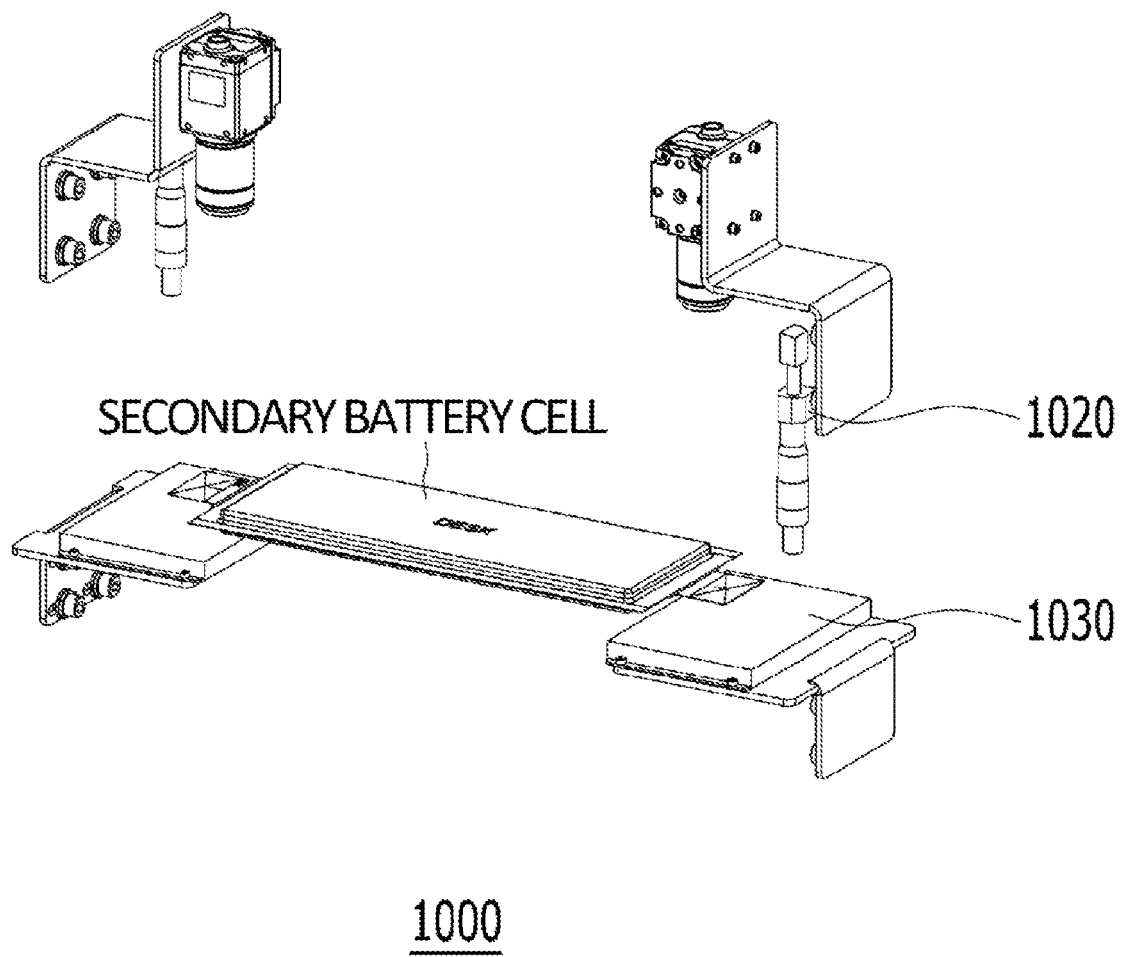
FIG. 10 is a perspective view illustrating a tab inspection apparatus according to an embodiment of the present disclosure.

FIG. 10 is a perspective view illustrating a tab inspection apparatus 1000 according to an embodiment of the present disclosure. Tab inspection apparatus 1000 is an example of tab inspection unit 180 shown in FIG. 1. Tab inspection apparatus 1000 may include a vision inspection unit 1020 and an illumination unit 1030. Vision inspection unit 1020 of tab inspection apparatus 1000 may be provided in a non-illustrated frame. As shown in FIG. 10, two vision inspection units 1020 may be provided in main body 1010 corresponding to respective electrode tabs. In some examples, vision inspection unit 1020 may obtain image data of the electrode tabs of the secondary battery cell being transferred in line. In one embodiment, a shutter speed of vision inspection unit 1020 may be set at a predetermined interval (e.g., 1/120 second). Tab inspection apparatus 1000 may inspect the length and shape of the electrode tabs by using the image data of the electrode tabs. Illumination unit 1030 may be spaced apart from the secondary battery cell (i.e., electrode tabs) at a predetermined distance (e.g., 10 mm), and may provide a predetermined light when vision inspection unit 1020 obtains an image.

Figure 11:
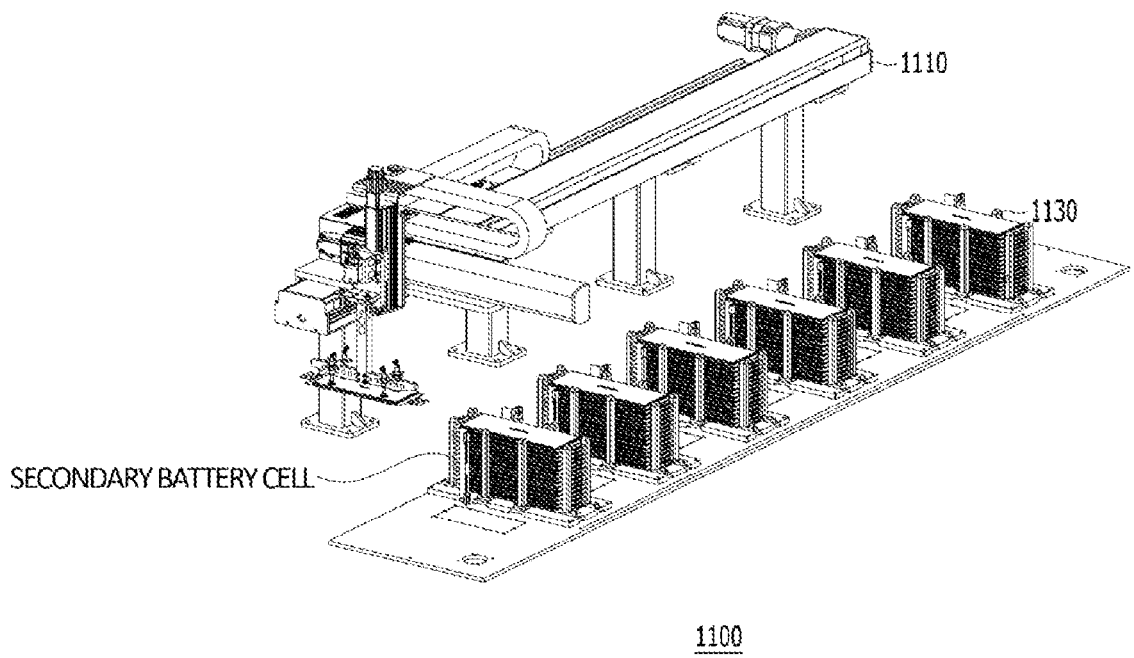
FIG. 11 is a perspective view illustrating a defect selection apparatus according to an embodiment of the present disclosure.

FIG. 11 is a perspective view illustrating a defect selection apparatus 1100 according to an embodiment of the present disclosure. Defect selection apparatus 1100 is an example of defect selection unit 180 shown in FIG. 1. Defect selection apparatus 1100 may include a cell transferer 1110 and a magazine set. The magazine set may include a plurality of magazines 1130. Each magazine 1130 may store one or more secondary battery cells. Cell transferer 1110 may select a defective secondary battery cell and load the selected secondary battery cell into magazine 1130. In some examples, cell transferer 1110 may transfer a secondary battery cell to predetermined magazine 1130 depending on the type of a defect of the secondary battery cell.

While certain example techniques have been described and shown herein using various methods and systems, it should be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter also may include all implementations falling within the scope of the appended claims, and equivalents thereof. Throughout this document, the term "connected to" may be used to designate a connection or coupling of one element to another element and includes both an element being "directly connected to" another element and an element being "electronically connected to" another element via another element. Through the whole document, the term "on" that is used to designate a position of one element with respect to another element includes both a case that the one element is adjacent to the other element and a case that any other element exists between these two elements. Further, through the whole document, the term "comprises or includes" and/or "comprising or including" used in the document means that one or more other components, steps, operation and/or existence or addition of elements are not excluded in addition to the described components, steps, operation and/or elements unless context dictates otherwise. Through the whole document, the term "about or approximately" or "substantially" is intended to have meanings close to numerical values or ranges specified with an allowable error and intended to prevent accurate or absolute numerical values disclosed for understanding of the present disclosure from being illegally or unfairly used by any unconscionable third party.

The scope of the present disclosure is defined by the following claims rather than by the detailed description of the embodiment. It shall be understood that all modifications and embodiments conceived from the meaning and scope of the claims and their equivalents are included in the scope of the present disclosure.

We claim:

1. An inspection system for inspecting secondary battery cells, comprising:
    a thickness measurement unit that measures thickness of each of a plurality of secondary battery cells;
    an electrical characteristic measurement unit that measures electrical characteristics of each of the plurality of secondary battery cells using electrode tabs of a corresponding secondary battery cell;
    a print processing unit that includes a data printer configured to print information about each of the plurality of secondary battery cells on a surface of a corresponding secondary battery cell, and a data verification unit configured to verify the printed information;
    a tab cutting unit that cuts electrode tabs of each of the plurality of secondary battery cells to a predetermined size;
    a mass measurement unit that measures the mass of each of the plurality of secondary battery cells;
    a tab inspection unit that obtains cut shapes of the electrode tabs of each of the plurality of secondary battery cells; and
    a defect selection unit that includes a plurality of magazines configured to store secondary battery cells, and a cell transferer configured to select some defective secondary battery cells from the plurality of secondary battery cells and transfer the selected secondary battery cells to the plurality of magazines,
    wherein the thickness measurement unit, the electrical characteristics measurement unit, the print processing unit, the tab cutting unit, the mass measurement unit, the tab inspection unit and the defect selection unit are arranged in series, and the plurality of secondary battery cells is transferred in line within the inspection system.

2. The inspection system of claim 1, further comprising:
    a controller operably linked to the thickness measurement unit, the electrical characteristic measurement unit, the print processing unit, the tab cutting unit, the mass measurement unit, the tab inspection unit and the defect selection unit,
    wherein the controller is configured to;
        control the in-line transfer of the plurality of secondary battery cells;
        control operations of the thickness measurement unit, the electrical characteristics measurement unit, the print processing unit, the tab cutting unit, the mass measurement unit, the tab inspection unit and the defect selection unit; and
        process data from the thickness measurement unit, the electrical characteristics measurement unit, the mass measurement unit and the tab inspection unit.

3. The inspection system of claim 1, further comprising:
    a cell supply and retrieval unit configured to unload the plurality of secondary battery cells from a cell tray on which the plurality of secondary battery cells are loaded, move the cell tray, and load, onto the cell tray, secondary battery cells having not been selected by the defect selection unit.

4. The inspection system of claim 1, wherein the thickness measurement unit includes a pressing plate for pressing a secondary battery cell, and wherein the thickness measurement unit measures the thickness of the secondary battery cell by measuring a plurality of points on a facing surface of the pressing plate in contact with the secondary battery cell.

5. The inspection system of claim 4, wherein the thickness measurement unit includes a linear variable differential transformer (LVDT).

6. The inspection system of claim 1, wherein the electrical characteristic measurement unit includes:
    an open circuit voltage/impedance reactance (OCV/IR) measurement unit that measures a no-load potential and an internal impedance of the secondary battery cell by contacting sensing grippers with two electrode tabs of a secondary battery cell;
    an insulation voltage measurement unit that measures an insulation voltage of the secondary battery cell by contacting the sensing grippers with an anode tab and a terrace of the secondary battery cell; and
    an insulation resistance measurement unit that measures an insulation resistance of the secondary battery cell by contacting the sensing grippers with a cathode tab and the terrace of the secondary battery cell.

7. The inspection system of claim 1, wherein the data printer of the print processing unit includes a plurality of print headers, and each of the plurality of print headers prints information about a secondary battery cell on the corresponding secondary battery cell.

8. The inspection system of claim 1, wherein the data verification unit of the print processing unit includes an optical reader configured to read the printed information, and the optical reader is inclined at 60 degrees with respect to a transfer direction of the secondary battery cell.

9. The inspection system of claim 1, wherein the tab cutting unit includes an upper cutter and a lower cutter that are replaceably fixed, and the upper cutter and the lower cutter have cutting blades at two facing edges, respectively.

10. The inspection system of claim 9, wherein the tab cutting unit further includes an air blower provided in at least one of a region where the upper cutter is fixed and a region where the lower cutter is fixed.

11. The inspection system of claim 1, wherein the cell transferer of the defect selection unit transfers a secondary battery cell to a predetermined magazine depending on the type of a defect of the secondary battery cell.

* * * * *